US006831132B2

(12) United States Patent
Liu et al.

(10) Patent No.: US 6,831,132 B2
(45) Date of Patent: Dec. 14, 2004

(54) FILM ADHESIVES CONTAINING MALEIMIDE COMPOUNDS AND METHODS FOR USE THEREOF

(75) Inventors: Puwei Liu, San Diego, CA (US); Stephen M. Dershem, San Diego, CA (US); Kang Yang, San Diego, CA (US); Carolyn C. Albino, San Diego, CA (US)

(73) Assignee: Henkel Corporation, Rocky Hill, CT (US)

( * ) Notice: Subject to any disclaimer, the term of this patent is extended or adjusted under 35 U.S.C. 154(b) by 0 days.

(21) Appl. No.: 10/113,909

(22) Filed: Mar. 28, 2002

(65) Prior Publication Data

US 2003/0199638 A1 Oct. 23, 2003

(51) Int. Cl.[7] ............... C08F 255/00; C08F 257/00; C08F 26/02; C08G 73/00
(52) U.S. Cl. ............... 525/193; 525/83; 525/89; 525/91; 525/282; 525/280; 525/218; 525/245; 525/263; 526/259; 526/303.1; 526/307.2; 526/305; 526/310; 526/312
(58) Field of Search .................. 525/193, 83, 89, 525/91, 282, 280, 218, 245, 263

(56) References Cited

U.S. PATENT DOCUMENTS

| | | | | |
|---|---|---|---|---|
| 5,015,695 A | * | 5/1991 | Wong | ............... 525/244 |
| 5,717,034 A | | 2/1998 | Dershem et al. | |
| 5,744,513 A | * | 4/1998 | White et al. | ............... 522/116 |
| 5,936,026 A | * | 8/1999 | Huybrechts et al. | ........ 524/504 |
| 5,973,166 A | | 10/1999 | Mizori et al. | |
| 2003/0087479 A1 | | 5/2003 | He et al. | ............... 438/113 |

FOREIGN PATENT DOCUMENTS

EP    0970 946 A2  * 12/2000

OTHER PUBLICATIONS

Oppolzer and Snieckus, "Intramolecular Ene Reactions in Organic Synthesis," Angew. Chem. For Ed. Engl., 17:476–486, 1978.

* cited by examiner

Primary Examiner—James J. Seidleck
Assistant Examiner—Olga Asinovsky
(74) Attorney, Agent, or Firm—Steven C. Rauman

(57) ABSTRACT

In accordance with the present invention, there are provided film adhesive compositions comprising at least one macromonomer having at least one unit of ethylenic unsaturation, at least one thermoplastic elastomer co-curable with the macromonomer, and at least one cure initiator, and methods for use thereof. Invention compositions are useful as adhesives in the microelectronics industry. In particular, invention film adhesives may be used to produce microelectronic assemblies with very thin bond lines without compromising adhesive strength.

29 Claims, No Drawings

FILM ADHESIVES CONTAINING MALEIMIDE COMPOUNDS AND METHODS FOR USE THEREOF

FIELD OF THE INVENTION

The present invention relates to film adhesive compositions, and more particularly to the use of film adhesive compositions in stacked die microelectronic packaging applications.

BACKGROUND OF THE INVENTION

In response to an increasing demand for semiconductor packages that are smaller, yet more functional, the microelectronic packaging industry has recently begun producing packages containing at least two stacked semiconductor dice. Indeed, it is often advantageous to stack multiple dice into the same package in order to increase circuit density without increasing the area occupied on a circuit board by the integrated circuit package.

Several challenges exist with respect to producing reliable electronic components containing stacked die packages. For example, stacked die packages typically require very thin bond lines between die (e.g., <15 microns). In addition, it is known that adhesive fillet and resin bleed associated with many adhesive formulations contribute to unreliable component performance. Thus, adhesives used in stacked die applications ideally would provide (at a minimum bond line thickness) superior adhesive strength and conductivity (thermal and electrical) without producing adhesive fillet or resin bleed. One possible approach to address this challenging problem lies in the use of film adhesives.

Accordingly, there is a need for film adhesives which provide superior adhesive strength and conductivity when dispensed to achieve very thin bond lines in a variety of microelectronic packages, such as, for example, stacked die packages.

SUMMARY OF THE INVENTION

In accordance with the present invention, there are provided film adhesive compositions comprising at least one macromonomer having at least one unit of ethylenic unsaturation, at least one thermoplastic elastomer co-curable with the macromonomer, and at least one cure initiator. Invention compositions are useful as adhesives in the microelectronics industry. In particular, invention film adhesives may be used to produce microelectronic assemblies with very thin bond lines without compromising adhesive strength.

In a further aspect of the present invention, there are provided methods employing invention film adhesive compositions for adhesively attaching a device to a substrate, and methods employing invention film adhesive compositions for adhesively attaching at least two semiconductor dice to a substrate in a stacked arrangement.

In a still further aspect of the invention, there are provided assemblies comprising a first article adhered to a second article by invention film adhesive compositions.

DETAILED DESCRIPTION OF THE INVENTION

In accordance with the present invention, there are provided adhesive compositions comprising at least one macromonomer having at least one unit of ethylenic unsaturation, at least one thermoplastic elastomer co-curable with the macromonomer, and at least one cure initiator.

As employed herein, "macromonomer" refers to a compound having properties suitable for use in invention film adhesive compositions. For example, macromonomers contemplated for use in the practice of the present invention typically are low melting point solids having low vapor pressures. Alternatively, macromonomers contemplated for use in the practice of the present invention may be liquids having a molecular weight of at least about 500 grams/mole.

As employed herein, "unit of ethylenic unsaturation" refers to unsaturation comprising localized (i.e., non-aromatic) carbon-carbon double bonds, as shown below:

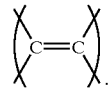

As employed herein, "co-curable" refers to the ability of a thermoplastic elastomer to undergo copolymerization with a macromonomer to form a three-dimensional polymeric network.

Macromonomers contemplated for use in the practice of the present invention include, for example, maleimides, vinyl compounds, allylated amides, and the like. In one embodiment, maleimide macromonomers contemplated for use in the practice of the present invention include compounds having the following structure:

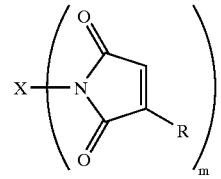

wherein:
  $m = 1-6$,
  R is independently selected from hydrogen or lower alkyl, and
  X is a monovalent moiety or a multivalent linking moiety.

Monovalent moieties or multivalent linking moieties are typically selected from
(I) straight or branched chain alkyl, alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl,
(II) siloxanes having the structure:

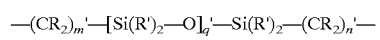

or

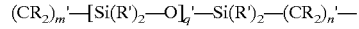

wherein
  each R is independently defined as above, and each R' is independently selected from hydrogen, lower alkyl or aryl, m' falls in the range of 1 up to 10, n' falls in the range of 1 up to 10, and q' falls in the range of 1 up to 50, (III) polyalkylene oxides having the structure:

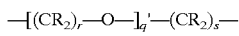

or

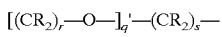

wherein each R is independently as defined above, r falls in the range of 1 up to 10, s falls in the range of 1 up to 10, and q' is as defined above, (IV) aromatic moieties having the structure:

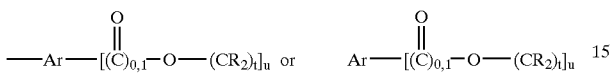

wherein each R is independently as defined above, t falls in the range of 2 up to 10, u is 1, 2 or 3, and Ar is as defined above, or

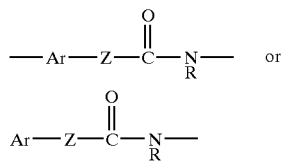

wherein
Z is O or NR, wherein R is hydrogen or lower alkyl, (V) urethanes having the structure

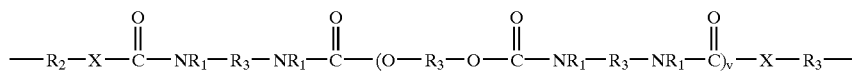

wherein:
each $R_1$ is independently hydrogen or lower alkyl,
each $R_2$ independently is an alkyl, aryl, or arylalkyl group having 1 to 18 carbon atoms;
$R_3$ is an alkyl or alkyloxy chain having up to about 100 atoms in the chain, which chain may contain aryl substituents;
X is O, S, N, or P; and
v is 0 to 50, (VI) aromatic moieties having the structure:

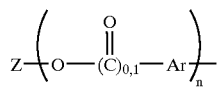

wherein
each Ar is a monosubstituted, disubstituted or trisubstituted aromatic or heteroaromatic ring having in the range of 3 up to about 10 carbon atoms,
n is 1 up to about 50, and
Z is selected from:
straight or branched chain alkyl, alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl,
siloxanes having the structure:

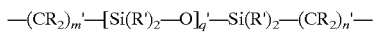

wherein
each R is independently defined as above, and each R' is independently selected from hydrogen, lower alkyl or aryl, m' falls in the range of 1 up to 10, n' falls in the range of 1 up to 10, and q' falls in the range of 1 up to 50, polyalkylene oxides having the structure:

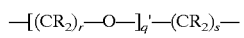

wherein each R is independently as defined above, r falls in the range of 1 up to 10, s falls in the range of 1 up to 10, and q' is as defined above, aromatic moieties having the structure:

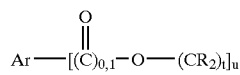

wherein each R is independently as defined above, t falls in the range of 2 up to 10, u is 1, 2 or 3, and Ar is as defined above, as well as mixtures of any two or more thereof.

As employed herein, "alkyl" refers to hydrocarbyl radicals having 1 up to about 20 carbon atoms, preferably 2–10 carbon atoms; and "substituted alkyl" comprises alkyl groups further bearing one or more substituents selected from hydroxy, alkoxy, mercapto, cycloalkyl, substituted cycloalkyl, heterocyclic, substituted heterocyclic, aryl, substituted aryl, heteroaryl, substituted heteroaryl, aryloxy, substituted aryloxy, halogen, cyano, nitro, amino, amido, C(O)H, acyl, oxyacyl, carboxyl, carbamate, sulfonyl, sulfonamide, sulfuryl, and the like.

As employed herein, "cycloalkyl" refers to cyclic ring-containing groups containing in the range of 3 up to about 8 carbon atoms, and "substituted cycloalkyl" refers to cycloalkyl groups further bearing one or more substituents as set forth above.

As employed herein, "alkenyl" refers to straight or branched chain hydrocarbyl groups having at least one carbon-carbon double bond, and having in the range of 2 up to about 12 carbon atoms, and "substituted alkenyl" refers to alkenyl groups further bearing one or more substituents as set forth above.

As employed herein, "alkylene" refers to divalent hydrocarbyl radicals having 1 up to about 20 carbon atoms, preferably 2–10 carbon atoms; and "substituted alkylene" comprises alkylene groups further bearing one or more substituents as set forth above.

As used herein, "oxyalkylene" refers to an alkylene moiety wherein one or more of the methylene units of the alkylene moiety has been replaced with an oxygen atom.

As employed herein, "aryl" refers to aromatic groups having in the range of 6 up to about 14 carbon atoms and "substituted aryl" refers to aryl groups further bearing one or more substituents as set forth above.

As employed herein, "alkenylene" refers to divalent, straight or branched chain hydrocarbyl groups having at least one carbon-carbon double bond, and having in the range of 2 up to about 12 carbon atoms, and "substituted alkenylene" refers to alkenylene groups further bearing one or more substituents as set forth above.

As employed herein, "oxyalkenylene" refers to an alkenylene moiety wherein one or more of the methylene units of the alkenylene moiety has been replaced with an oxygen atom.

Preferred maleimides contemplated for use in the practice of the present invention include, for example, maleimides having the following structures:

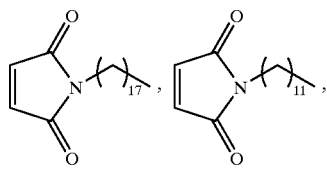

Vinyl macromonomers contemplated for use in the practice of the present invention include compounds having the following structure:

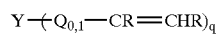

wherein:
q is 1, 2 or 3,
each R is independently selected from hydrogen or lower alkyl,
each Q is independently selected from —O—, —O—C(O)—, —C(O)— or —C(O)—O—, and

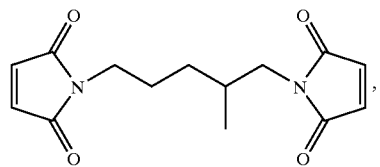

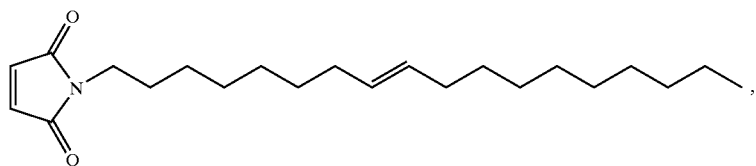

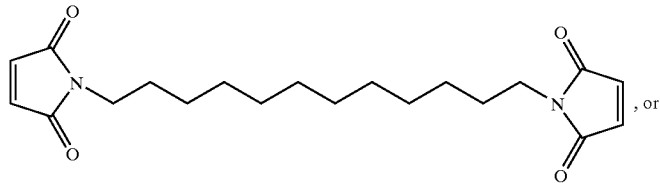

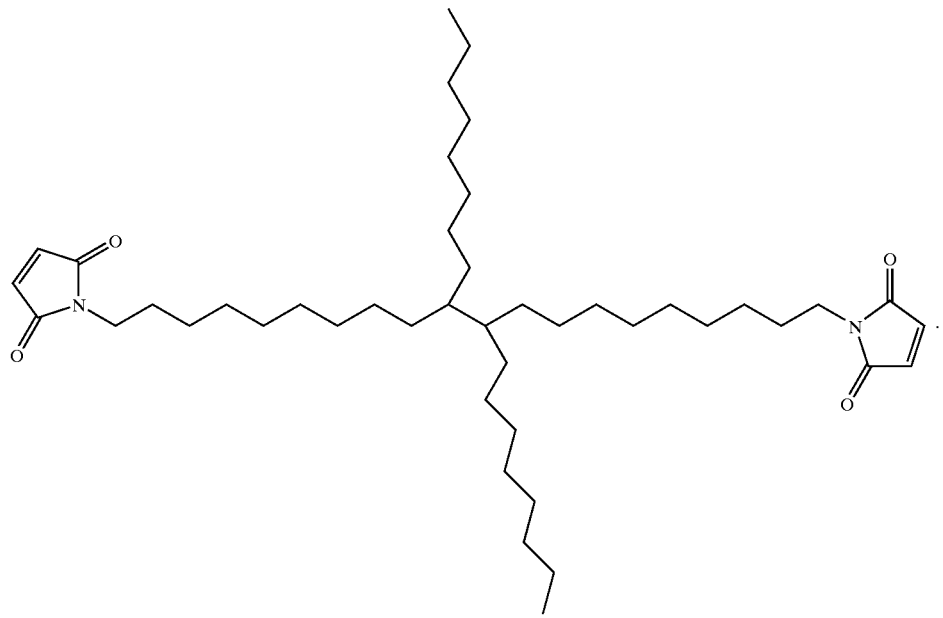

Y is a monovalent moiety or a multivalent linking moiety.

The multivalent linking moiety Y is typically selected from:

(I) straight or branched chain alkyl, alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl, (II) siloxanes having the structure:

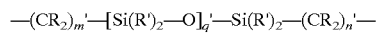

or

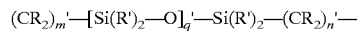

wherein
each R is independently defined as above, and each R' is independently selected from hydrogen, lower alkyl or aryl, m' falls in the range of 1 up to 10, n' falls in the range of 1 up to 10, and q' falls in the range of 1 up to 50, (III) polyalkylene oxides having the structure:

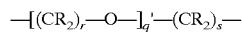

or

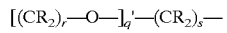

wherein each R is independently as defined above, r falls in the range of 1 up to 10, s falls in the range of 1 up to 10, and q' is as defined above, (IV) aromatic moieties having the structure:

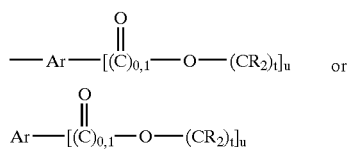

wherein each R is independently as defined above, t falls in the range of 2 up to 10, u is 1,2 or 3, and Ar is as defined above, or

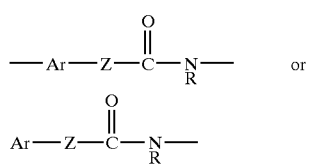

wherein
Z is O or NR, wherein R is hydrogen or lower alkyl, (V) urethanes having the structure

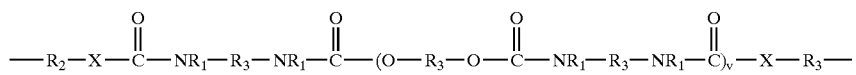

wherein:
each $R_1$ is independently hydrogen or lower alkyl,
each $R_2$ independently is an alkyl, aryl, or arylalkyl group having 1 to 18 carbon atoms;
$R_3$ is an alkyl or alkyloxy chain having up to about 100 atoms in the chain, which chain may contain aryl substituents;
X is O, S, N, or P; and
v is 0 to 50, (VI) aromatic moieties having the structure:

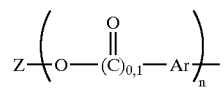

wherein
each Ar is a monosubstituted, disubstituted or trisubstituted aromatic or heteroaromatic ring having in the range of 3 up to about 10 carbon atoms,
n is 1 up to about 50, and
Z is selected from:
straight or branched chain alkyl, alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl,
siloxanes having the structure:

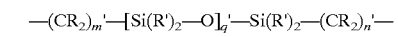

wherein
each R is independently defined as above, and each R' is independently selected from hydrogen, lower alkyl or aryl, m' falls in the range of 1 up to 10, n' falls in the range of 1 up to 10, and q' n falls in the range of 1 up to 50,
polyalkylene oxides having the structure:

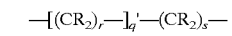

wherein each R is independently as defined above, r falls in the range of 1 up to 10, s falls in the range of 1 up to 10, and q' is as defined above,
aromatic moieties having the structure:

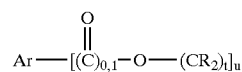

wherein each R is independently as defined above, t falls in the range of 2 up to 10, u is 1, 2 or 3, and Ar is as defined above,
as well as mixtures of any two or more thereof.

Allylated amide macromonomers contemplated for use in the practice of the present invention include compounds having the following structure:

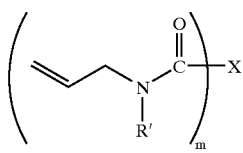

wherein:
R' is hydrogen, $C_1$ up to about $C_{18}$ alkyl or oxyalkyl, allyl, aryl, or substituted aryl,
X is as defined above, and
m is 1–6.

Thermoplastic elastomers contemplated for use in the practice of the present invention are typically block copolymers. The block copolymers have at least one unit of the general formula (A-B), or (A-B-A), wherein A is a non-elastomeric polymer block and B is an elastomeric polymer block. Block copolymers contemplated for use in the practice of the present invention preferably have low dielectric constants. In addition, thermoplastic elastomers contemplated for use in the practice of the present invention contain pendant and/or terminal units of ethylenic unsaturation, and therefore are able to cure with other components in the adhesive composition, such as the unsaturated macromonomer.

In one aspect of the invention, the non-elastomeric polymer block (A) is the polymerization product of one or more optionally substituted aromatic hydrocarbons containing at least one unit of ethylenic unsaturation. Aromatic hydrocarbons contemplated for use in the practice of the present invention include, for example, optionally substituted styrene, optionally substituted stilbene, and the like. Substituents contemplated for optional use in the practice of the present invention include for example, alkyl, alkenyl, alkynyl, hydroxy, alkoxy, alkenoxy, and the like. In a preferred embodiment, the aromatic hydrocarbon is optionally substituted styrene.

The elastomeric polymer block (B) is typically the polymerization or copolymerization product of optionally substituted olefin monomers and/or optionally substituted conjugated diene monomers. Olefin monomers contemplated for use in the practice of the present invention typically contain from 2 up to about 20 carbon atoms. Preferably, the olefin monomers contain from 2 up to about 12 carbon atoms. In a particularly preferred embodiment, the olefin monomers include, for example, ethylene, propylene, butylene, isobutylene, acrylonitrile, (meth)acrylate, and the like. Most preferably, the olefin monomer is acrylonitrile.

Conjugated diene monomers contemplated for use in the practice of the present invention typically contain from 4 up to about 20 carbon atoms. Preferably, the conjugated diene monomers contain from 4 up to about 12 carbon atoms. In a particularly preferred embodiment, the conjugated diene monomers include, for example, butadiene, isoprene, dimethylbutadiene, and the like. Most preferably, the conjugated diene monomer is butadiene.

The structure of the elastomeric segments can be optionally modified to increase adhesive strength of invention compositions. For example, the elastomeric segments of the block copolymers (e.g., the polybutadiene segments) may be modified via a thermally induced ene-reaction with maleic anhydride (for a review of the ene-reaction, see, for example, Oppolzer, W., Snieckus, V., *Angew. Chem. Int. Ed. Engl.*, 1978, 17, 476). Such modification has a particularly positive impact on hot die-shear values.

Thermoplastic elastomers contemplated for use in the practice of the present invention include, for example, polystyrene-polybutadiene-polystyrene block copolymers, polystyrene-polyisoprene-polystyrene block copolymers, polystyrene-polydimethylbutadiene-polystyrene block copolymers, polybutadiene-polyacrylonitrile block copolymers, and the like. Preferably, the block copolymer is a polystyrene-polybutadiene-polystyrene block copolymer or a polybutadiene-polyacrylonitrile block copolymer.

Adhesive compositions of the invention also contain in the range of 0.2 up to 2 weight % of at least one free radical initiator, wherein weight % (wt %) is based on the total weight of the composition. As employed herein, the term "free radical initiator" refers to any chemical species which, upon exposure to sufficient energy (e.g., light, heat, or the like), decomposes into at least two species which are uncharged, but which each possesses at least one unpaired electron. Preferred free radical initiators contemplated for use in the practice of the present invention are compounds which decompose (i.e., have a half life in the range of about 10 hours) at temperatures in the range of about 70 up to 180° C.

Free-radical cure initiators contemplated for use in the practice of the present invention include for example, peroxides (e.g., peroxy esters, peroxy carbonates, hydroperoxides, alkylperoxides, arylperoxides, and the like), azo compounds, and the like. Presently preferred peroxides contemplated for use in the practice of the present invention include dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis (tert-butyl peroxyisopropyl)benzene, tert-butyl hydroperoxide, and the like. Presently preferred azo compounds contemplated for use in the practice of the present invention include 2,2'-azobis(2-methylpropanenitrile), 2,2'-azobis(2-methylbutanenitrile) 1,1'-azobis (cyclohexanecarbonitrile), and the like.

Adhesive compositions contemplated for use in the practice of the present invention typically contain in the range of about 10 wt % up to about 95 wt % thermoplastic elastomer, in the range of about 5 wt % up to about 90 wt % macromonomer having at least one unit of ethylenic unsaturation, and in the range of about 0.5 wt % up to about 2.0 wt % a cure initiator, wherein weight % is based on the total weight of the composition. Preferably, the macromonomer having at least one unit of ethylenic unsaturation is present in the range of about 10 wt % up to about 80 wt %.

Adhesive compositions according to the invention optionally further contain in the range of about 0.1 up to about 10 wt % of at least one coupling agent, based on the total weight of the composition. Preferably, the coupling agent is present in the range of about 0.2 wt % up to about 5 wt %. Coupling agents contemplated for use in the practice of the present invention include siloxanes, silicate esters, metal acrylate salts, titanates, and the like.

Adhesive compositions according to the invention may optionally contain a filler. Fillers contemplated for optional use in the practice of the present invention may optionally be conductive (electrically and/or thermally). Electrically conductive fillers contemplated for use in the practice of the present invention include, for example, silver, nickel, gold, cobalt, copper, aluminum, graphite, silver-coated graphite, nickel-coated graphite, alloys of such metals, and the like, as well as mixtures thereof. Both powder and flake forms of filler may be used in the adhesive compositions of the present invention. Preferably, the flake has a thickness of less than about 2 microns, with planar dimensions of about 20 to about 25 microns. Flake employed herein preferably has a surface area of about 0.15 to 5.0 $m^2/g$ and a tap density of about 0.4 up to about 5.5 g/cc. It is presently preferred that powder employed in the practice of the invention has a diameter of about 0.5 to 15 microns. If present, the filler typically comprises in the range of about 1 wt % up to about 95 wt % of the adhesive formulation, wherein weight % is based on the total weight of the composition.

Thermally conductive fillers contemplated for optional use in the practice of the present invention include, for example, aluminum nitride, boron nitride, silicon carbide, diamond, graphite, beryllium oxide, magnesia, silica, alumina, and the like. Preferably, the particle size of these fillers will be in the range of about 5 up to about 30 microns. Most preferably, the particle size of these fillers will be about 20 microns.

Electrically and/or thermally conductive fillers are optionally (and preferably) rendered substantially free of catalytically active metal ions by treatment with chelating agents, reducing agents, nonionic lubricating agents, or mixtures of such agents. Such treatment is described in U.S. Pat. No. 5,447,988, which is incorporated by reference herein in its entirety.

Optionally, a filler may be used that is neither an electrical nor thermal conductor. Such fillers may be desirable to impart some other property to the adhesive formulation such as, for example, reduced thermal expansion of the cured adhesive, reduced dielectric constant, improved toughness, increased hydrophobicity, and the like. Examples of such fillers include perfluorinated hydrocarbon polymers (i.e., TEFLON™), thermoplastic polymers, thermoplastic elastomers, mica, fused silica, glass powder, and the like.

In a preferred embodiment, adhesive compositions contemplated for use in the practice of the present invention contain in the range of about 5 wt % up to about 90 wt % thermoplastic elastomer, in the range of about 5 wt % up to about 90 wt % macromonomer containing at least one unit of ethylenic unsaturation, in the range of about 0.5 wt % up to about 2.0 wt % cure initiator, in the range of about 0.5 wt % up to about 5 wt % coupling agent, and in the range of about 1 wt % up to about 95 wt % filler, wherein weight % is based on the total weight of the composition.

In a further aspect of the invention, there are provided methods for adhesively attaching a device to a substrate comprising subjecting a sufficient quantity of an invention adhesive composition positioned between a substrate and a device to conditions suitable to cure the adhesive formulation. Devices contemplated for use in the practice of the present invention include any surface mount component such as, for example, semiconductor die, resistors, capacitors, and the like. Preferably, devices contemplated for use in the practice of invention methods are semiconductor dies. Substrates contemplated for use include metal substrates (e.g., lead frames), organic substrates (e.g., laminates, ball grid arrays, polyamide films), and the like.

Conditions suitable to cure invention film adhesive compositions comprise subjecting invention film adhesive compositions to a temperature of at least about 150° C. but less than about 300° C. for about 0.5 up to about 2 minutes. This rapid, short duration heating can be accomplished in a variety of ways, e.g., with an in-line heated rail, a belt furnace, or the like.

Alternatively, conditions suitable to cure invention film adhesive compositions comprise subjecting invention film adhesive compositions to a temperature in the range of about 120° C. up to about 200° C. for a period of about 15 minutes up to about 60 minutes. These conditions can be readily produced in a variety of ways, such, for example, by placing invention film adhesive compositions in a curing oven.

In a still further aspect of the invention, there are provided methods for adhesively attaching at least two semiconductor dice to a substrate in a stacked arrangement comprising curing a sufficient quantity of an invention adhesive composition positioned between the substrate and each of the die.

In yet another aspect of the present invention, there are provided assemblies comprising a first article permanently adhered to a second article by a sufficient quantity of an invention adhesive composition.

The invention will now be described in greater detail by reference to the following non-limiting example.

EXAMPLE

An adhesive composition according to the present invention was prepared as follows. Invention Formulation 1 was prepared using the styrene-butadiene block copolymer KRATON™ D-1102 as the thermoplastic elastomeric component. Octadecylmaleimide and X-BMI (X-BMI is the 1,20-bismaleimido derivative of 10,11-dioctyl-eicosane) were employed as macromonomers. The maleimides used in the following invention formulations were prepared according to the procedure set forth in U.S. Pat. No. 5,973,166, the entire contents of which are incorporated by reference herein.

| Invention Formulation 1 | | |
|---|---|---|
| 1. | Octadecylmaleimide | 1.0 g |
| 2. | KRATON ™ D-1102 | 2.5 g |
| 3. | X-BMI | 1.5 g |
| 4. | Ricon 130[1] | 0.2 g |
| 5. | Silane coupling agent[2] | 0.2 g |
| 6. | Dicumyl peroxide | 0.05 g |
| 7. | Xylene | 5.0 g |
| 8. | TEFLON ™ filler | 6.9 g |

[1]Polybutadiene 20% grafted with maleic anhydride (Sartomer)
[2]Proprietary silane-containing coupling agent.

Preparation of Formulation 1 began by dissolving octadecylmaleimide in xylene. KRATON was added to this solution and allowed to dissolve completely before the remaining components were added.

A film of Invention Formulation 1 was cast onto a glass substrate and dried overnight. A silicon die was then placed onto the film, and the film-coated substrate was heated to 80° C. for 1 to 3 seconds. This assembly was finally cured at 185° C. for 30 minutes.

The film adhesive compositions were tested for room temperature die shear and hot die shear on a calibrated Dage 2400 die shear tester. The results for Invention Formulation 1 are shown below in Table 1, compared to QMI536, a non-film adhesive formulation (prepared according to U.S. Pat. No. 5,717,034) comprising the same maleimides as employed for the preparation of Invention Formulation 1. Also included in Table 1 are die shear values after the cured compositions were subjected to 85° C./85% humidity for 24 hrs.

TABLE 1

|  | Room Temperature Die Shear (lbs) | Hot Die Shear (245° C.) (lbs) |
| --- | --- | --- |
| QMI536, initial | 59.1 | 24.4 |
| Invention Formulation 1, initial | 88.9 | 25.9 |
| QMI536, 24 hrs. 85/85 | 52.6 | 23.9 |
| Invention Formulation 1, 24 hrs. 85/85 | 79.6 | 24.6 |

The results shown above demonstrate that Invention Formulation 1 has superior adhesive strength compared to an analogous non-film forming composition.

While the invention has been described in detail with reference to certain preferred embodiments thereof, it will be understood that modifications and variations are within the spirit and scope of that which is described and claimed.

What is claimed is:

1. A thermally curable film adhesive composition comprising:
    a curable component comprising at least one macromonomer having at least one unit of ethylenic unsaturation, wherein said macromonomer is a maleimide,
    in the range of about 20–90 wt % of at least one thermoplastic elastomer co-curable with said at least one macromonomer, and
    at least one free-radical cure initiator,
    wherein wt % is based on total weight of the composition.

2. An adhesive composition according to claim 1, wherein said thermoplastic elastomer is the polymerization or copolymerization product of optionally substituted olefin monomers and/or optionally substituted conjugated diene monomers.

3. An adhesive composition according to claim 2, wherein said olefin monomers contain from 2 up to about 20 carbon atoms.

4. An adhesive composition according to claim 3, wherein said olefin monomers contain from 2 up to about 12 carbon atoms.

5. An adhesive composition according to claim 2, wherein said olefin monomers are selected from the group consisting of ethylene, propylene, butylene, isobutylene, acrylonitrile, and (meth)acrylate.

6. An adhesive composition according to claim 2, wherein said conjugated diene monomers contain from 4 up to about 20 carbon atoms.

7. An adhesive composition according to claim 6, wherein said conjugated diene monomers contain from 4 up to about 12 carbon atoms.

8. An adhesive composition according to claim 2, wherein said conjugated diene monomers are selected from the group consisting of butadiene, isoprene, and dimethylbutadiene.

9. An adhesive composition according to claim 1, wherein said thermoplastic elastomer is a block copolymer.

10. An adhesive composition according to claim 9, wherein said block copolymer has at least one unit of the general formula (A-B), or (A-B-A), wherein A is a non-elastomeric polymer block and B is an elastomeric polymer block.

11. An adhesive composition according to claim 10, wherein said non-elastomeric polymer block is the polymerization product of one or more optionally substituted aromatic hydrocarbons containing at least one unit of ethylenic unsaturation.

12. An adhesive composition according to claim 11 wherein said aromatic hydrocarbon is styrene or substituted styrene.

13. An adhesive composition according to claim 10, wherein said elastomeric polymer block is the polymerization product of optionally substituted olefin monomers and/or optionally substituted conjugated diene monomers.

14. An adhesive composition according to claim 10, wherein said block copolymer is a member selected from the group consisting of polystyrene-polybutadiene-polystyrene block copolymer, a polystyrene-polyisoprene-polystyrene block copolymer, a polystyrene-polydimethylbutadiene-polystyrene block copolymer, and a polybutadiene-polyacrylonitrile block copolymer.

15. An adhesive composition according to claim 1, wherein said free radical cure initiator is present in the range of about 0.5 wt % up to about 2.0 wt %.

16. An adhesive composition according to claim 1, wherein said free-radical cure initiator is a member selected from the group consisting of peroxy ester, a peroxy carbonate, a hydroperoxide, an alkylperoxide, an arylperoxide, and an azo compound.

17. An adhesive composition according to claim 1, further comprising a coupling agent.

18. An adhesive composition according to claim 17, wherein said coupling agent is a member selected from the group consisting of siloxane, a silicate ester, a metal acrylate, and a titanate.

19. An adhesive composition according to claim 17, wherein said coupling agent is present in the range of about 0.2 wt % up to about 5 wt %, wherein wt % is based on total weight of the composition.

20. A thermally curable film adhesive composition comprising:
    in the range of about 5 wt % up to about 90 wt % thermoplastic elastomer co-curable with at least one unsaturated macromonomer,
    in the range of about 5 wt % up to about 90 wt % of a curable component comprising an unsaturated macromonomer, wherein said macromonomer is a maleimide,
    in the range of about 0.5 wt % up to about 2.0 wt % free-radical cure initiator,
    in the range of about 0.5 wt % up to about 5 wt % coupling agent, and
    in the range of about 1 wt % up to about 95 wt % filler, wherein wt % is based on total weight of the composition.

21. An adhesive composition according to claim 1, wherein said maleimide is a liquid.

22. An adhesive composition according to claim 21, wherein said maleimide has the following structure:

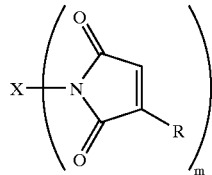

wherein:
m=1–6,
R is independently selected from hydrogen or lower alkyl, and
X is a monovalent moiety or a multivalent linking moiety.

23. An adhesive composition according to claim 22, wherein said monovalent moiety or multivalent linking moiety is selected from (I) straight or branched chain alkyl, alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl, (II) siloxanes having the structure:

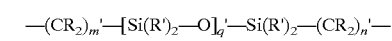

or

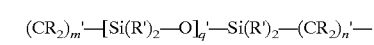

wherein
each R is independently defined as above, and each R' is independently selected from hydrogen, lower alkyl or aryl, m' falls in the range of 1 up to 10, n' falls in the range of 1 up to 10, and q' falls in the range of 1 up to 50, (III) polyalkylene oxides having the structure:

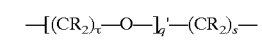

or

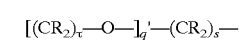

wherein each R is independently as defined above, r falls in the range of 1 up to 10, s falls in the range of 1 up to 10, and q' is as defined above, (IV) aromatic moieties having the structure:

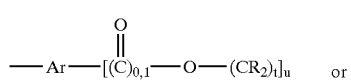   or

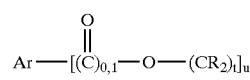

wherein each R is independently as defined above, t falls in the range of 2 up to 10, u in 1, 2 or 3, and Ar is as defined above, or

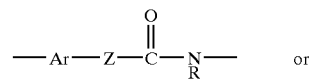   or

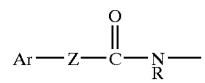

wherein
Z is O or NR, wherein R is hydrogen or lower alkyl, (V) urethanes having the structure

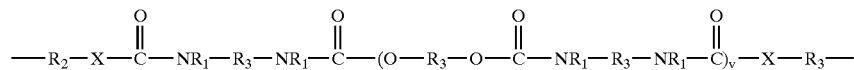

wherein:

each $R_1$ is independently hydrogen or lower alkyl,
each $R_2$ independently is an alkyl, aryl, or arylalkyl group having 1 to 18 carbon atoms;
$R_3$ is an alkyl or alkyloxy chain having up to about 100 atoms in the chain, which chain may contain aryl substituents;
X is O, S, N, or P, and
v is 0 to 50, (VI) aromatic moieties having the structure:

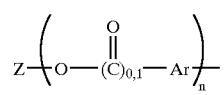

wherein
each Ar is monosubstituted, disubstituted or trisubstituted aromatic or heteroaromatic ring having in the range of 3 up to about 10 carbon atoms,
n is 1 up to about 50, and
Z is selected from:
straight or branched chain alkyl, alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl,
siloxanes having the structure:

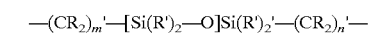

wherein
each R is independently defined as above, and each R' is independently selected from hydrogen, lower alkyl or aryl, m' falls in the range of 1 up to 10, n' falls in the range of 1 up to 10, and q' falls in the range of 1 up to 50, polyalkylene oxides having the structure:

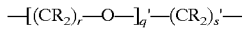

wherein each R is independently as defined above, r falls in the range of 1 up to 10, s falls in the range of 1 up to 10, and q' is as defined above, aromatic moieties having the structure:

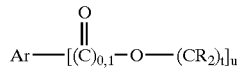

wherein each R is independently as defined above, t falls in the range of 2 up to 10, u is 1, 2 or 3, and Ar is as defined above, as well as mixtures of any two or more thereof.

24. A method for adhesively attaching a device to a substrate, said method comprising subjecting an adhesive formulation according to claim 1 positioned between said substrate and said device to conditions suitable to cure said adhesive formulation.

25. A method according to claim 24, wherein said device is a semiconductor die.

26. A method for adhesively attaching at least two semiconductor dice to a substrate in a stacked arrangement, said method comprising curing an adhesive formulation according to claim 1 positioned between said substrate and each of said dice.

27. An assembly comprising a first article permanently adhered to a second article by a cured aliquot of the adhesive composition according to claim 1.

28. An adhesive composition according to claim 1, wherein said macromonomer comprises one or more maleimide groups attached to an alkyl or alkylene linkage capable of curing at a temperature in the range of about 150° C. up to about 200° C. in a period of time of about 0.25 minutes up to about 2 minutes.

29. An assembly comprising a substrate sod plurality of semiconductor dice positioned on said substrate in a stacked arrangement, wherein each of said semiconductor die is adhered to either the substrate or another die by a cured aliquot of the adhesive composition according to claim 1, wherein said composition comprises a maleimide macromonomer.

* * * * *